United States Patent
Gruner et al.

(10) Patent No.: US 7,808,615 B2
(45) Date of Patent: Oct. 5, 2010

(54) PROJECTION EXPOSURE APPARATUS AND METHOD FOR OPERATING THE SAME

(75) Inventors: Toralf Gruner, Aalen-Hofen (DE); Olaf Conradi, Westerhofen (DE); Nils Dieckmann, Hüttlingen (DE); Markus Schwab, Herzogenaurach (DE); Olaf Dittmann, Bopfingen (DE); Michael Totzeck, Schwaebisch Gmuend (DE); Daniel Kraehmer, Aalen (DE); Vladimir Kamenov, Essingen (DE)

(73) Assignee: Carl Zeiss SMT AG, Oberkochen (DE)

( * ) Notice: Subject to any disclaimer, the term of this patent is extended or adjusted under 35 U.S.C. 154(b) by 1035 days.

(21) Appl. No.: 11/427,183

(22) Filed: Jun. 28, 2006

(65) Prior Publication Data

US 2008/0002167 A1 Jan. 3, 2008

Related U.S. Application Data

(60) Provisional application No. 60/697,065, filed on Jul. 5, 2005.

(51) Int. Cl.
G03B 27/54 (2006.01)
G03B 27/32 (2006.01)
(52) U.S. Cl. ............................ 355/67; 355/77
(58) Field of Classification Search .................. 355/53, 355/67, 77; 250/216
See application file for complete search history.

(56) References Cited

U.S. PATENT DOCUMENTS 5,424,803 A * 6/1995 Noguchi ..................... 355/53
5,880,817 A * 3/1999 Hashimoto ................. 355/53

FOREIGN PATENT DOCUMENTS

DE 199 56 354 A1 6/2001
DE 103 01 799 A1 4/2004
WO WO-2005/026843 A2 3/2005

OTHER PUBLICATIONS

N. F. Borrelli et al., "Densification of fused silica under 193-nm excitation", *J. Opt. Soc. Am. B*, vol. 14, No. 7 (Jul. 1997) pp. 1606-1615.

* cited by examiner

*Primary Examiner*—Peter B Kim
(74) *Attorney, Agent, or Firm*—Fish & Richardson P.C.

(57) ABSTRACT

The invention concerns a method for operating a projection exposure apparatus to project the image of a structure of an object (5) arranged in an object plane (6) onto a substrate (10) arranged in an image plane (8). The object (5) is illuminated with light of an operating wavelength of the projection exposure apparatus according to one of several adjustable exposure modes. The light produces changes in at least one optical element (9) of the projection exposure apparatus, by which the optical properties of the projection exposure apparatus are influenced. The operation of the projection exposure apparatus makes allowance for the influencing of the optical properties of the projection exposure apparatus or a quantity dependent on the former, being calculated approximately on the basis of the exposure mode used and the structure of the object (5).

18 Claims, 3 Drawing Sheets

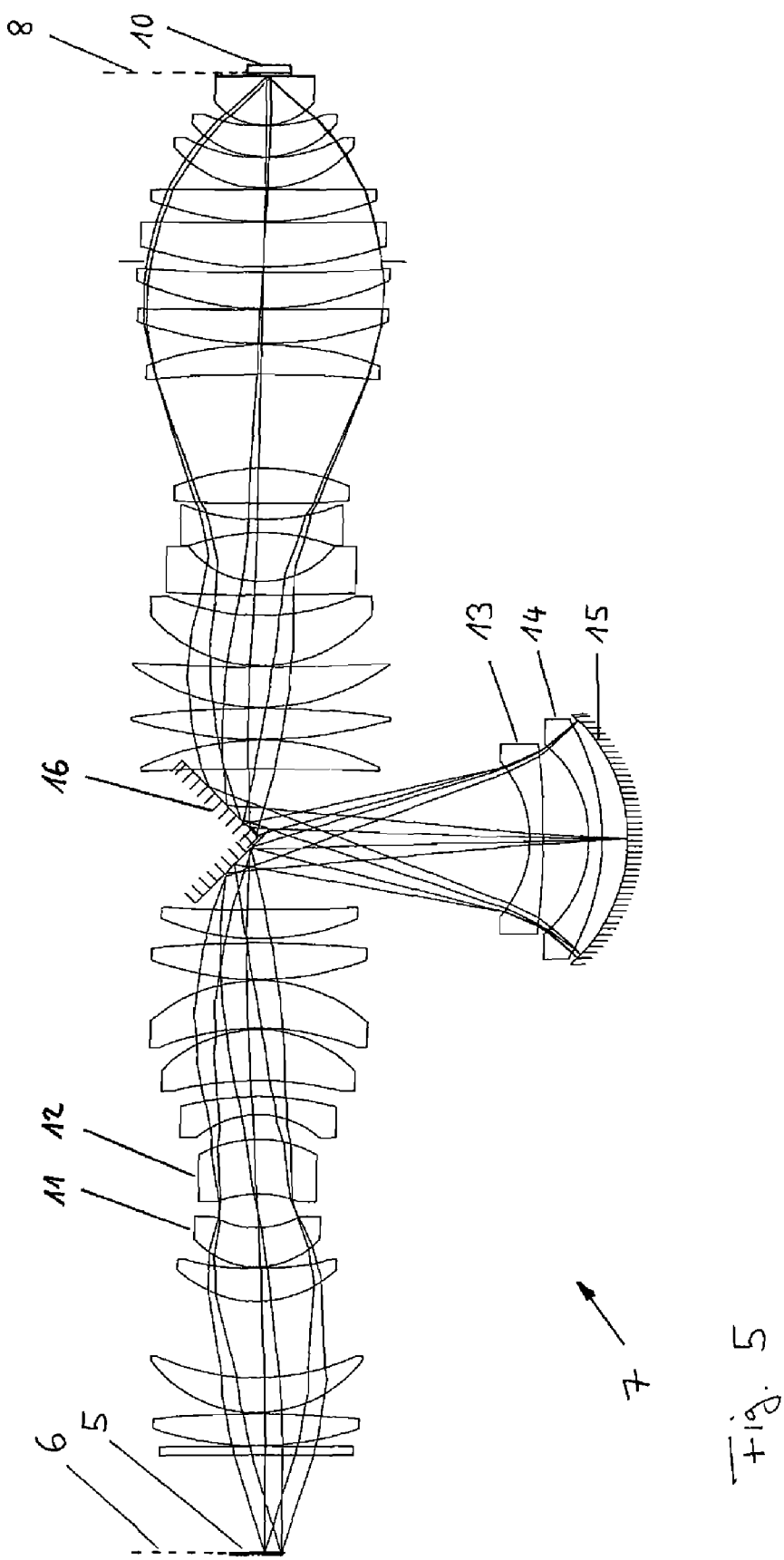

PROJECTION EXPOSURE APPARATUS AND METHOD FOR OPERATING THE SAME

CROSS-REFERENCE TO RELATED APPLICATION

Figure 1:
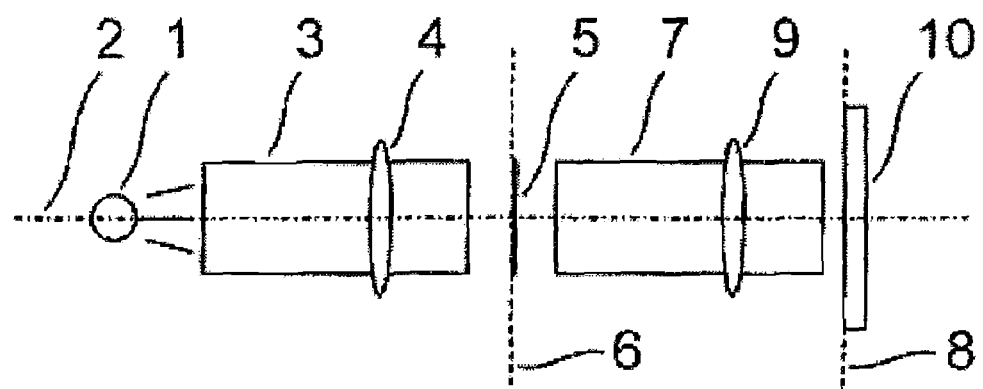

The present application claims priority to U.S. patent application Ser. No. 60/697,065, filed Jul. 5, 2005, which is hereby incorporated by reference in its entirety.

SPECIFICATION

The invention concerns a method for operating a projection exposure apparatus, especially for microlithography. Furthermore, the invention concerns a projection exposure apparatus and a method for making a projection exposure apparatus, as well as an exposure system and a projection lens.

For an economical operation of a projection exposure apparatus, the shortest possible exposure time is desirable, so as to achieve a high throughput rate of substrates being exposed. This means that high radiation intensities are required for an adequate exposure of the substrates. In particular, when using radiation in the UV or X-ray region, the influence of intensive radiation can result in radiation-induced changes in the properties of the optical elements of the projection exposure apparatus, and the magnitude of these changes will increase with the radiation dose. For example, the effect of the radiation can be a compaction (increased density) or a rarefaction (reduced density).

An investigation of the radiation-induced density increase of quartz glass (fused silica) is the subject of a publication by N. F. Borrelli et al., "Densification of fused silica under 193-nm excitation", J. Opt. Soc. Am. B, Vol. 14, No. 7 (July 1997) 1606-1615. This describes the determination of the densification from interferometric and double refraction measurements by means of a finite element analysis. The finite element analysis is needed to ascertain the radiation-induced densification independently of the sample size and geometry, the exposure pattern, and the intensity profile of the beam used.

Steps are also already known for minimizing unwanted effects of radiation-induced change in properties of optical elements. Thus, DE 199 56 354 B4 discloses a method for compensating of rotationally nonsymmetrical imaging errors, whereby an optical element is turned about a particular pivot angle and turned back about a particular counter-angle. For this, the optical element or its housing is connected to a frame, being able to turn by at least one bearing.

From DE 103 01 799 A1 as well there is known how to operate a projection exposure apparatus in a correction mode, in which correction light is directed onto a correction region of an optical component, which in a projection mode is not exposed to the projection light, or not sufficiently exposed. By the occasional exposure of the correction region directly adjoining the projection region, the material properties of the optical component are also changed there, and this reduces the gradient in the material properties.

The radiation dose at which the radiation-induced changes in properties of the optical elements exceed acceptable values for the particular application can be determined in advance by means of computations or measurements done on a prototype or on some other experimental layout and it can be appropriately factored in to the operation. But in any case, one can only deduce reliable information from this if the operating conditions of the projection exposure apparatus do not differ too much from the circumstances in which the computations or measurements were carried out. At any rate, the operators of projection exposure apparatus are increasingly able to attune the lighting conditions in the most optimal manner to their needs. Thus, there is known from PCT/EP2004/010188 an exposure system for a microlithography projection exposure apparatus with which different exposure modes can be adjusted so as to optimize, for example, the exposure independently of the structures of the individual artwork being projected (masks, reticles). This individual adjustment of the exposure mode means that the actual operating conditions will generally depart from the conditions used in the computations or measurements previously carried out. This, in turn, means that such computations or measurements are only of limited use and it is very difficult to predict, under these circumstances, when certain threshold values will be passed by the operation of the projection exposure apparatus.

One problem of the invention is to keep the radiation-induced changes of the optical properties in a projection exposure apparatus within a reliable range.

This problem is solved by a method with the combination of features of claim 1.

In the method of the invention for operating a projection exposure apparatus to project the image of a structure of an object arranged in an object plane onto a substrate arranged in an image plane, the object is illuminated with light of an operating wavelength of the projection exposure apparatus according to one of several adjustable exposure modes. The light produces changes in at least one optical element of the projection exposure apparatus, by which the optical properties of the projection exposure apparatus are influenced. The operation of the projection exposure apparatus makes allowance for the influencing of the optical properties of the projection exposure apparatus or a quantity dependent on the former, being calculated approximately on the basis of the exposure mode used and the structure of the object.

The approximate calculation requires so little computer expense that it can be done, for example, by the operator of the projection exposure apparatus as need be. Each time, the current and the future desired conditions in regard to the exposure mode and the reticle structure are taken into account. In particular, if the exposure modes and/or reticles are changing, one can obtain more reliable information than that for a onetime calculation in advance for a scenario assumed to be constant over the entire operating period.

In the context of the invented method, it is especially irreversible changes in at least one optical element of the projection exposure apparatus that are captured. The changes mentioned in the following discussion in at least one optical element are also assumed to be irreversible changes. In particular, the changes in the at least one optical element of the projection exposure apparatus are produced by compaction or rarefaction.

The exposure mode can enter the approximate calculation in the form of an angle distribution of the light in the object plane. This angle distribution is generally known, so that no additional expense is incurred in finding it. In the approximation calculation, operating phases of the projection exposure apparatus with different exposure modes and/or different objects can be taken into account in that they enter the approximation calculation in the form of a root mean square weighted according to the length of the operating phases.

The influencing of the optical properties of the projection exposure apparatus or of the quantity depending on them can be factored in cumulatively. Thus, each time the prior history can be taken into account.

Preferably, the method of the invention is designed so that, in the context of the approximation calculation, a diffraction angle distribution of the light diffracted by the object will be calculated. Furthermore, one can take into account a characteristic quantity of a projection lens in the approximation computation, by means of which the structure of the object is projected onto the substrate. The characteristic quantity of the projection lens can enter the approximation computation, for example, in the form of a rectangular function. In particular, the characteristic quantity of the projection lens can be connected to the diffraction angle distribution.

Preferably, the approximation computation will make use of at least one parameter that is determined in advance by a comparison of the approximation computation against a computation by another method of computation and/or against a measurement. The other method of computation here can be, for example, a finite element calculation. The parameter can be determined in advance by comparison of several approximation calculations with several calculations according to the other computation method or with several measurements. The calculations or the measurements will be carried out for several different exposure modes. For each exposure mode, an approximation computation and a computation by the other computation method will be carried out.

Depending on the outcome of the approximately calculated influencing of the optical properties of the projection exposure apparatus or the quantity dependent thereon, one can change the position of one or more optical elements by a translatory and/or a rotatory movement. In this way, one can take countermeasures against locally pronounced changes of the optical elements when the approximation calculation indicates that appropriate action is warranted. As an additional or alternative countermeasure, it is possible to replace one or more optical elements. It is likewise possible to alter the shape of one or more optical elements as a countermeasure. This can be done, for example, by a mechanical acting on the optical element.

In the course of the approximation computation, one can determine a maximum value of a characteristic quantity for the light used to operate the projection exposure apparatus. For example, one can determine the maximum energy content of a light pulse directly downstream from the object. In particular, one can define the maximum value such that, if maintained, one can assume that a threshold value for the influencing of the optical properties of the projection exposure apparatus or a quantity dependent thereon will not be exceeded during a given operating period. In this way, one can create a relatively reliable basis for establishing and maintaining warranty time periods.

Moreover, the possibility exists, during the approximation computation, of determining a characteristic quantity to indicate the modification produced by the influencing of the optical properties of the projection exposure apparatus in the light passing through the latter.

In one variant of the invented method, one determines, on the basis of an exposure dose found for one or more optical elements, whether a threshold value for the influencing of the optical properties of the projection exposure apparatus or a quantity dependent thereon is transgressed. If the threshold value is transgressed, at least one countermeasure is taken for at least one optical element that was used when determining the transgression of the threshold value.

In another variant of the invented method, the light used has a polarized state in at least one partial region of the projection exposure apparatus and brings about a radiation-induced double refraction in at least one optical element of the projection exposure apparatus. This optical element is rotated about an angle in such a way that the double refracting region of the optical element is still exposed to light, but the influencing of the light based on the double refraction is less than before the rotation, due to a changed orientation between the double refracting region of the optical element and the direction of polarization of the light.

The invention, furthermore, pertains to a projection exposure apparatus for projecting the image of a structure of an object arranged in an object plane onto a substrate arranged in an image plane. The projection exposure apparatus has at least one optical element in which the light used for the projection of the image brings about changes which influence the optical properties of the projection exposure apparatus. One or more such optical elements are arranged so that they can be moved transversely to the direction of an optical axis of the projection exposure apparatus. In particular, the movable optical element has a periodic structure parallel with the direction of movement and can be moved by an integer multiple of a period of this structure.

In another sample embodiment of the projection exposure apparatus, one or more optical elements which bring about an especially strong influencing of the optical properties of the projection exposure apparatus are installed easily accessible and/or able to be positioned in the projection exposure apparatus and thus can be replaced with less expense than other comparable optical elements which use a measurement technique to detect the optical properties of the projection exposure apparatus.

In a further modified sample embodiment of the projection exposure apparatus, one or more optical elements have a rate of change reduced by a preliminary exposure.

Preliminary exposure, pivoting arrangement, or easy replaceability is especially provided for at least one optical element through which the light used to project the image passes multiple times. Likewise, these steps can be adopted for at least one optical element whose usable optical surface has a diameter of at most 240 mm, preferably at most 200 mm. This holds especially when one or more such optical element is arranged near the aperture diaphragm. Near the aperture diaphragm in the present connotation means that the ratio between the subaperture radius $R_{sub}$ at the locus of the particular optical element and the usable height $H_{opt\_frei}$ of the particular optical element is greater than 0.7. The subaperture radius $R_{sub}$ refers to the largest radius of the subapertures, i.e., the pencil of rays emerging from an object point at the locus of the particular optical element. The usable height $H_{opt\_frei}$ refers to the maximum distance of the optically used surface of the particular optical element from the optical axis.

In all variants of the invented projection exposure apparatus, one can arrange for them to operate with polarized light in at least one partial region.

The invention pertains moreover to an exposure system for a projection exposure apparatus. The exposure system has at least one optical element in which the light passing through the exposure system brings about changes which influence the optical properties of the exposure system. One or more such optical elements are arranged so that they can pivot or move transverse to the direction of one optical axis of the exposure system. Likewise, the possibility also exists of installing one or more such optical elements in the exposure system so that they can be replaced with less expense than other comparable optical elements in which the light produces little or no change.

The invention pertains, furthermore, to a method for making a projection exposure apparatus for projecting the image of a structure of an object arranged in an object plane onto a substrate arranged in an image plane. At least one optical element is installed in the projection exposure apparatus in which the light used for the projection brings about changes which influence the optical properties of the projection exposure apparatus. This optical element is modified by a preliminary exposure so that the changes brought about by a future action of light on the optical element prove to be less than would be the case without the modification due to the preliminary exposure.

Preferably, an optical element is installed in the projection exposure apparatus that is modified by preliminary exposure to light of wavelength used for the operation of the projection exposure apparatus. The preliminary exposure, in particular, brings about a compaction or rarefaction in the optical element. It can be arranged that the influencing of the optical properties of the projection exposure apparatus brought about by the preliminary exposure is at least for the most part compensated by means of compensation measures. To shorten the exposure time, the preliminary exposure can also be done with light of shorter wavelength than the operating wavelength. Furthermore, the wavelength for the preliminary exposure can be chosen such that an economically available light source can be used for the preliminary exposure.

The invented projection lens has at least one optical element situated at a clear distance from the image plane amounting to at most 15%, preferably at most 8%, of the structural length of the projection lens and is subjected to a preliminary exposure, arranged so as to pivot, or can be replaced with less expense than other comparable optical elements. Likewise, the possibility exists of arranging at least one optical element of the projection lens in the above-mentioned manner, situated at a clear distance of not more than 200 mm, preferably not more than 100 mm from the image plane.

By clear distance from the image plane is meant in the present context the least distance between the surface of the optical element and the image plane.

The invention shall now be explained more closely below by means of the sample embodiments presented in the drawing.

These show

Figure 2:
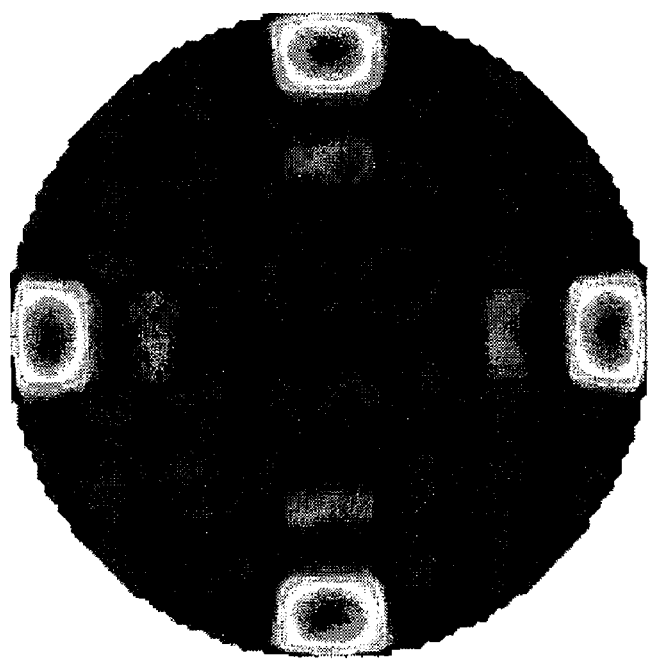
Figure 3:
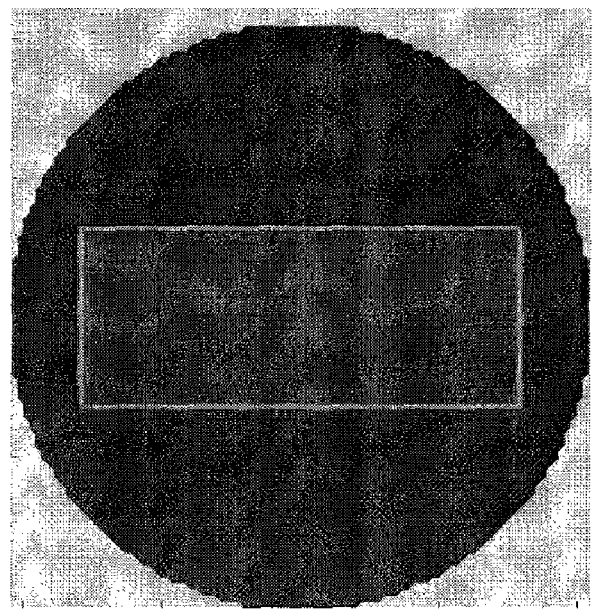
Figure 4:
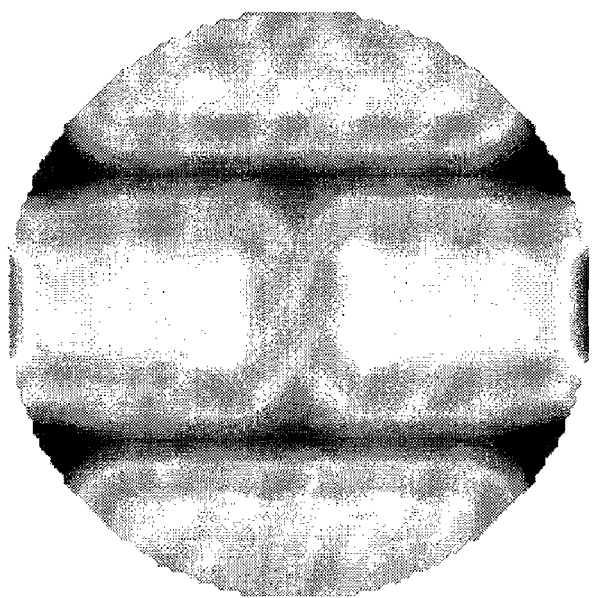

FIG. 1 a greatly simplified block diagram of a projection exposure apparatus,

FIG. 2 a diffraction angle distribution, produced by a reticle with horizontal and vertical lines, relative to the plane of the drawing, under a quadrupole illumination, FIG. 3 a rectangular function in a representation corresponding to FIG. 2, FIG. 4 an intensity distribution generated by the convolution of the diffraction angle distribution shown in FIG. 2 with the rectangular function shown in FIG. 3 and FIG. 5 a sample embodiment of the projection lens in a meridional cross section.

FIG. 1 shows a greatly simplified block diagram of a projection exposure apparatus. The projection exposure apparatus has a light source 1, producing light with a wavelength in the UV-region or in the soft X-ray region and situated, in the sample embodiment depicted, on an optical axis 2, defined by the following described components of the projection exposure apparatus. For example, the light source 1 can be an ArF-excimer laser, emitting light with a wavelength of 193 nm. In the context of the invention, however, other kinds of light sources 1 can be used, such as a $F_2$-excimer laser with a wavelength of around 157 nm, a KrF-excimer laser with a wavelength of 248 nm, etc.

The light produced by the light source 1 is taken to an exposure system 3, having a plurality of optical elements 4, only one of which is shown symbolically. The exposure system 3 serves to illuminate in optimal manner a reticle 5 coming after the exposure system 3 in the beam path, also known as a mask, and situated in an object plane 6. The exposure system 3 can be configured, in particular, such that the exposure mode can be adapted to the reticle 5 being used. Such an exposure system has been described, for example, in PCT/EP2004/010188.

The structures formed on the reticle 5 are projected by means of a projection lens 7 arranged after the reticle 5 in an image plane 8, which comes after the projection lens 7. Similar to the exposure system 3, the projection lens 7 also has a plurality of optical elements 9, only one of which is shown symbolically. The optical elements 4 and 9 can consist, for example, of quartz glass (fused silica).

In the image plane 8 is a wafer 10 or some other substrate, having a photosensitive layer, which is exposed by means of the projection exposure apparatus. The exposure transfers the structure of the reticle 5 onto the wafer 10 or other substrate. After exposing the wafer 10 by means of the projection exposure apparatus, the wafer 10 undergoes processing based on the structures created by the exposure. After this, an additional exposure and a further processing based on that can ensue. This procedure is repeated as often as it takes for the wafer 10 to have all desired structures.

To achieve short exposure times, one uses light of very high intensity for the exposure. This has the consequence that the optical elements 4 and 9 of the exposure system 3 and the projection lens 7 are subjected to a very intense bombardment with UV light or soft X-rays. What is more, the bombardment for at least some of the optical elements 4 and 9 is not distributed uniformly over their entire usable surface, but rather concentrated in partial regions which are sometimes much smaller than the usable surface. Hence, very high intensities can occur locally, which alter the material properties and thus also the optical properties in the exposed regions more and more in the course of time. For example, the bombardment can increase the density of the material, also known as compaction, or reduce the density, known as rarefaction. This is the case when using either polarized or unpolarized light, and local density gradients can result in a stress-related double refraction. Furthermore, the bombardment can produce a change in transmission (solarization) or the formation of microchannels. When using polarized light, additional effects may occur, such as a polarization-induced double refraction. The described radiation-induced and possibly other changes in the optical properties of the optical elements 4 and 9 can result in a nonuniform intensity, a fluctuating polarization state, aberrations, and so on.

The radiation-induced changes in the optical properties of the optical elements 4 and 9 with increasing irradiation time can result in the exposure system 3 or the projection lens 7 no longer fulfilling the given specifications and thus the projection exposure apparatus is no longer usable or of only limited use. After how long a time of use of the projection exposure apparatus an unacceptable deviation from the specification will occur depends in large measure on the exposure mode or modes being used. A reliable prediction of the time of use or which operating parameters are needed to achieve a specified minimum time of use is only possible if one knows the exposure modes actually being used. In any case, such computations thus far have been very cumbersome and therefore can hardly be done in their present form as a routine measure each time the exposure mode is changed by the operator of the projection exposure apparatus. For this reason, an approximation calculation is provided in the context of the invention, using comparatively slight computing expense and making allowance for the exposure modes and reticle structures being used to approximately calculate, for example, the remaining time of use within specifications or the operating parameters needed to achieve the minimum time of use.

In order to achieve high precision with the approximation calculation, one takes into account several parameters that are initially determined one time in advance for the particular layout of the projection lens 7. To determine the parameters, one compares the results of elaborate calculations or measurements against data found by arithmetical operations on which the approximation calculation is based. The sought parameters are obtained by fitting the approximately calculated data to the results of the elaborate calculations or measurements. Specifically, one will preferably proceed as follows:

A series of finite element calculations is carried out to find a root-mean-square (RMS) value of the wavefront deviation of the light caused by radiation-induced changes in the properties of the optical elements 4 of the projection lens 7 for different exposure modes. One will preferably take into account typical exposure modes, such as dipole exposure, quadrupole exposure, annular field exposure, etc. The procedure for the finite element computations is familiar in itself and therefore will not be discussed further. The root-mean-square (RMS) value of the wavefront deviation is defined in familiar manner in terms of the Zernike coefficients. The values computed with the finite element method, in order to distinguish them from other values for the root-mean-square (RMS) value of the wavefront deviation, shall be designated hereafter as RMS_0. Alternatively or in addition to the computations, measurements can also be carried out for the same purpose, and once again the results shall be referred to with the designation RMS_0.

For the same exposure modes as used in the finite element computations or measurements, the following arithmetical operations are also carried out, to be used afterwards in the approximation calculation of the root-mean square (RMS) value of the wavefront deviation as well:

At first, one determines the Fourier transform of the reticle structure. The following discussion is based, for example, on a reticle structure consisting of two kinds of lines, oriented perpendicular to each other. Making reference to the following depicted representations, there are horizontal and vertical lines. The Fourier transform of the reticle structure is convoluted with the angular distribution of the light impinging on the reticle 5. The following description refers, for example, to an exposure mode with a quadrupole illumination. The result of the convolution is a diffraction angle distribution g, which is represented in FIG. 2.

FIG. 2 shows a diffraction angle distribution g generated by a reticle 5 with horizontal and vertical lines, in terms of the plane of the drawing, under a quadrupole illumination. Horizontally and vertically plotted is the sine of the angle formed by the diffracted light with the optical axis 2. The zero point lies in the middle of the image. The region depicted is bounded by the numerical aperture at the object side, i.e., at the object plane 6. The diffraction angle distribution shows four intense maxima, arranged in the shape of a cross in the marginal region.

The diffraction angle distribution g shown in FIG. 2 is convoluted with a distribution which is specific to the lens. If the projection lens 7 has a rectangular scanner slot, a rectangular function rect [a, b], as shown in FIG. 3 and also known as a top hat, is especially suitable for this.

FIG. 3 shows a rectangular function rect [a, b] in a representation corresponding to FIG. 2. In particular, the region shown is bounded, similar to FIG. 2, by the numerical aperture at the object side. The rectangular function rect [a, b] represents a rectangle with a ratio of its sides corresponding to the scanner slot. To determine suitable values for the side lengths a and b of the rectangle, the convolution is performed for a series of rectangular functions rect [a, b], each time holding constant the side ratio of the rectangle and varying its surface content. The outcome of such a convolution is shown in FIG. 4.

FIG. 4 shows an intensity distribution f generated by the convolution of the diffraction angle distribution g shown in FIG. 2 with the rectangular function rect [a, b] shown in FIG. 3. The type of representation corresponds to those of FIGS. 2 and 3. The intensity distribution f is substantially broadened in comparison to the diffraction angle distribution g, with the principal effect being in the horizontal direction, corresponding to the orientation of the rectangle in FIG. 3. From the intensity distribution f, one can compute an intermediate result RMS_C for the root-mean-square of the wavefront deviation as follows:

$$\mathrm{RMS\_C}^2 = \frac{\int (f^2 - \hat{f}^2) dA}{\int dA}$$

Here, the suffix "C" indicates that this is an intermediate result. The mean value $\hat{f}$ of the intensity distribution f is defined as $$\hat{f} = \frac{\int f dA}{\int dA}.$$

In similar manner, RMS_C values are calculated for the other exposure modes for which finite element computations and/or measurements were previously done, each time yielding RMS_0 values. After this, the RMS_C values are adapted by a fit curve to the RMS_0 values. The fit curve is defined by the linear equation $$RMS\_0 = c + d \cdot RMS\_C$$

having the same parameters c and d for all exposure modes included. The adaptation is done by trial and error for all rectangular functions rect [a, b] used in the computations of the RMS_C values, and for each rectangular function rect [a, b] there is determined a fit curve allowing for all exposure modes involved. Out of all these fit curves determined in this way one selects the one furnishing the best overall adaptation of the RMS_C values to the RMS_0 values. The rectangular distributions rect [a, b] used for these fit curves and the parameters c and d are noted down and used afterwards in the approximation calculation of the root-mean-square RMS value of the wavefront deviation. The data noted down hold for one configuration of the projection lens 7, so that one needs to proceed accordingly for other configurations and determine a similar data set for each lens shape used.

As shall be further explained below, the data set found for one configuration of the projection lens 7 can be used to carry out approximation computations for any given reticle structures and any given exposure modes. In particular, the approximation computations can also be carried out for reticle structures and exposure modes that were not used in finding the data set. The procedure of the invention for performing the approximation computations, which are done in particular by the operator of the projection exposure apparatus, shall be explained below:

For the given reticle structure and the angular distribution of the exposure as dictated by the chosen exposure mode in the region of the reticle 5, one first calculates in the previously described manner the RMS_C value for the root-mean-square of the wavefront deviation. For this, the angular distribution of the exposure is convoluted with the Fourier transform of the reticle structure. The thus determined diffraction angle distribution g is convoluted with the rectangular function rect [a, b], obtained from the data set for the basic form of the projection lens 7, and in this way the intensity distribution f is found. Using the above-given formulas for RMS_$C^2$ and f, the intensity distribution f is used to calculate the RMS_C value.

The RMS_C value can then be processed in various ways. In a first variant of the invented method, the RMS_C value is used to determine an approximation value RMS_A for the current or a future root-mean-square value of the wavefront deviation. For this, one first determines a tentative value RMS_1 for the root-mean-square value of the wavefront deviation using the data set for the basic configuration of the projection lens 7, where:

$$RMS\_1 = c + d \cdot RMS\_C.$$

As a rule, the actual values for the number of laser pulses N, the energy per laser pulse E behind the reticle 5 or the pulse length τ will differ from the values $N_0$, $E_0$ and $\tau_0$, used in the finite element computations or the measurements and used to determine the data set. Therefore, the tentative value RMS_1 needs to be adapted appropriately for the root-mean-square value of the wavefront deviation in order to find the approximation value RMS_A. For this, one uses the empirically determined equation $$RMS\_A = \left(\frac{N}{N_0}\right)^{0.6} \cdot \left(\frac{\tau_0}{\tau}\right)^{0.6} \cdot \left(\frac{E}{E_0}\right)^{1.2} \cdot RMS\_1$$

where:

$$\tau = \frac{\left(\int I(t) dt\right)^2}{\int I(t)^2 dt}$$

Here, I(t) characterizes the time function of the laser pulse intensity. If N is the number of laser pulses generated thus far, the value RMS_A corresponds to the root-mean-square value found by the approximation calculation of the invention for the wavefront deviation at the current time for the basic configuration of the projection lens 7, the reticle 5 actually used, and the exposure mode actually used. Likewise, a future anticipated RMS_A value can also be determined for a number of laser pulses greater than N.

If different exposure modes and/or reticle structures are used one after the other in the course of time, this circumstance can be taken into account by the invented method in that the diffraction angle distribution g is replaced by a mixed exposure angle distribution gmix, which is determined as follows from the individual diffraction angle distributions $g_i$ for each combination of exposure mode and reticle structure used:

$$gmix = \sqrt{\gamma_1 g_1^2 + \gamma_2 g_2^2 + \cdots + \gamma_M g_M^2}.$$

The $\gamma_i$ indicate the relative shares of the squared diffraction angle distributions $g_i^2$, i.e.

$$\sum_i \gamma_i = 1.$$

In another variant of the invented method, the RMS_C value serves as a starting point for further computations in order to make sure that no radiation-induced transgression of the given specifications will occur within a given lifetime of the projection lens 7, which can correspond to a warranty period, for example. For this, one uses the RMS_C value to calculate a maximum energy Emax which the laser pulse is allowed to have behind the reticle 5:

$$E_{\max} = E_0 \sqrt{\frac{N_{0\tau}}{N_{\tau 0}}} \cdot \left(\frac{RMS\ \max}{c + d \cdot RMS\_C}\right)^{\frac{1}{1.2}}$$

Here, RMSmax is the maximum allowable root-mean-square value of the wavefront deviation for the basic configuration of the projection lens 7. If the laser pulses after the reticle 5 do not exceed the maximum energy Emax calculated in this way for the reticle structure used and for the exposure mode setting, one can assume with high probability that no radiation-induced transgression of the specification will occur within the given lifetime of the projection lens 7.

In this variant of the invented method as well, different exposure modes and/or reticle structures used one after the other in the course of time can be taken into account in that the diffraction angle distribution g is replaced by the mixed diffraction angle distribution gmix. The formulas already described can be used here without change.

The invented method can also be employed in another way than that described above. For example, the results obtained with it can dictate whether or when to replace optical elements 9 to prevent an operation of the projection lens 7 off the specification. In particular, a replacement of optical elements 9 can be called for if they are exposed to an especially high radiation intensity or if even relatively slight changes in the optical properties have a major influence on the wavefront deviation. It is not absolutely necessary here to determine the conditions for each individual optical element 9. In many instances, it is enough to use the invented method to determine whether or when the entire projection lens 7 transgresses the specification for a given exposure mode and a given reticle structure. If it has been determined in advance, by detailed onetime finite element calculations or by measurements, which optical elements 9 are critically involved in the transgression of the specification, one does not have to identify these critical optical elements 9 again each time. It is sufficient to consider only the overall effect caused by all optical elements 9 and this can be done in very simple manner with the above-described approximation calculation. In any case, one can also identify the critical optical elements 9 again during each approximation calculation.

If the approximation calculation shows that a transgression of the specification is imminent or has already taken place, one possible remedy is to replace the critical optical elements 9 mainly involved in the transgression of the specification. To facilitate this replacement, one can arrange in the context of the invention to install these optical elements 9 in the projection lens 7 so that they can be replaced with the least possible expense. For this, in particular, one will make sure that the critical optical elements 9 are well accessible, i.e., for example, in order to replace critical optical elements 9 not located in an end region of the projection lens 7 one does not have to remove optical elements 9 next to them in the end region. Furthermore, any encapsulation or cooling jacket present for the projection lens 7 will be configured in the region of the critical optical elements 9 so that openings are present to replace the critical optical elements 9. Thanks to these and possibly other measures, one will make possible in particular a replacement of the critical optical elements 9 in situ.

Moreover, the approximation calculations make possible a prospective planning of the replacement of critical optical elements 9, so that this can be done, for example, during an otherwise scheduled maintenance, or several critical optical elements 9 can be coordinated and replaced at the same time, thereby keeping the down time of the projection exposure apparatus as little as possible and making it possible to order the required spare parts in good time.

Alternatively to a replacement, or as a first step toward a replacement, one can also arrange to move optical elements 9 whose symmetry properties so allow transversely to the optical axis 2 and/or to rotate them about a rotational axis of symmetry. Suitable for the first movement are planar optical elements 9, such as headlight lenses, diffractive optical elements 9, etc. Such optical elements 9 will then be mounted in the projection lens 7 so that a displacement is possible with reasonable expense and any misalignments caused by this will be kept in reasonable bounds, or a fine-tuning will then be performed. If the optical element 9 being moved has a periodic structure parallel to the direction of movement, one will perform in particular a displacement by an integer multiple of periods. If the position of the structure has little or no effect on the imaging properties in parallel with the direction of movement or if no structure at all is present, one can perform the displacement along any desired lengths, which are optimized in regard to radiation-induced changes, for example.

A rotation is possible, e.g., for optical elements 9 fashioned as lenses and it requires that the optical elements 9 can be mounted to turn with sufficient precision. Such a mounting is described in DE 199 56 354 B4.

The displacement or rotation of such optical elements 9 can be done, for example, during routine maintenance chores. In particular, when there is a drive unit to perform the displacement or rotation, shorter intervals of time are also possible with no problem. Furthermore, the possibility exists of using the above-described approximation calculation to determine when a displacement or rotation should be carried out. The displacement or rotation can be done for single optical elements 9 or for groups of optical elements 9. The displacement or rotation will distribute the radiation load over a larger region of the particular optical element 9, so that the effects of the radiation load are reduced.

The performance of the described steps to reduce the effects of radiation-induced changes in the optical elements 9 can also be made to depend on the results of an estimation procedure, described hereafter, which is carried out in addition or as an alternative to the approximation calculation. In this estimation procedure, one determines the exposure of each optical element 9 for the exposure mode used in dependence on its position, for example, in the form of a position-dependent energy density distribution of the light. For this, one can either carry out already known arithmetical methods at the particular time or resort to previously calculated and tabulated values. With the values so determined, one can predict how the radiation dose of the optical elements 9 will increase under the particular exposure mode. Taking into account the radiation dose accumulated thus far, one can in this way indicate the overall radiation dose for each optical element 9 as a function of its location. From this, one determines the material damage which has occurred and the concomitant changes in the optical properties. If these changes are no longer tolerable, the steps already described will be taken, such as replacement or changing the position of optical elements 9, and the overall radiation load will be reduced accordingly for the affected optical elements 9.

Likewise, the information on the overall radiation dose can also be evaluated along with the approximation calculation described at the outset. In this case, one finds from the approximation calculation when the projection lens 7 as a whole will transgress the specification and from the estimation procedure the optical elements 9 which are mainly responsible for this. For these optical elements 9, then, the steps described will be taken and their overall radiation dose will again be reduced accordingly.

The critical optical elements 9 of the projection lens 7 can also be replaced without using the approximation calculation or the estimation procedure or have their position changed. In this case, there also exists the possibility, in addition or alternatively, of replacing optical elements 4 of the exposure system 3 that are subject to large radiation-induced changes or of changing their position. The same holds for optical elements 4 of the exposure system 3 having great influence on those properties of the exposure system 3 that are the subject of a specification.

Given the precision requirements, a sufficiently precise mechanism which ensures an exact position after a replacement or a position change of the particular optical element 4, 9 is difficult if not impossible to achieve. Therefore, the invention proposes that the optical elements 4, 9 needing to be replaced or changed in position are arranged adjustably in the projection exposure apparatus. For example, for pivoting optical elements 4, 9 or those replaced and having rotational symmetry, an adjustment in terms of several degrees of freedom is provided. Besides the actual rotation, there can also be a centering and/or a tilting movement. In order to achieve the highest precision possible, a measurement technique can be provided in the projection exposure apparatus, by which one can check the adjusted position of the optical element 4, 9 being adjusted. With the measurement technique, one can determine positional data for the optical element 4, 9 being adjusted or for a mount in which the optical element 4, 9 is secured. Likewise, the measurement technique can be configured so that, in addition or alternatively, it detects the light which has passed through the optical element 4, 9 being adjusted. In particular, the measurement technique can also be connected to a feedback control loop, so as to automate the adjustment process as much as possible.

As an additional or alternative measure, the invention also provides for deliberately exposing in advance especially the critical optical elements 4, 9 of the exposure system 3 or the projection lens 7 with light of the operating wavelength of the projection exposure apparatus. One can also use a wavelength other than the operating wavelength for this, in particular, a shorter wavelength. A shorter wavelength can reduce the length of the exposure. The wavelength for the preliminary exposure can also be chosen in regard to an economical radiation source. Thanks to the preliminary exposure, one can partly anticipate radiation-induced changes expected during the actual operation and compensate for them already during the fabrication of the projection exposure apparatus. This predictive method will be used preferably if the changes caused again by the action of radiation diminish with increasing radiation dose or even pass into a saturation state. Besides the preliminary exposure, one will carry out steps to compensate at least for most of the changes in the optical properties caused by the preliminary exposure. For this, one can apply aspheric correction coatings on the optical elements 4 or 9, for example. The aspheric corrections can be applied to the exposed or other optical elements 4, 9. With gray filters, one can compensate for intensity fluctuations. Polarization-influencing means can be used to mitigate perturbing birefringence effects.

The invented steps for reducing the radiation-induced change in the optical properties of the projection exposure apparatus can be used in projection exposure apparatus operating with nonpolarized light. In particular, these steps can also be used in projection exposure apparatus operating in at least a partial region with polarized light. The use of polarized light can have substantial influence on which optical elements 4 or 9 are critical and how strong are the radiation-induced changes. Furthermore, especially in regard to a radiation-induced double refraction, the possibility exists of allowing for the type of polarization and/or direction of polarization in regard to the angle of turn when rotating an optical element 4, 9. In particular, the angle of turn of the particular optical element 4, 9 is chosen such, when the double refraction is no longer tolerable, that the direction of polarization of the light after the rotation of the optical element 4, 9 is oriented at least approximately perpendicular to or approximately parallel with the direction in which the index of refraction is a maximum due to the radiation effect. In this way, although the double refraction is not prevented or reduced, it no longer acts as a perturbation. Said rotation of the optical element 4, 9 should be contemplated in particular for a change in the polarization state of the light and/or a change in the reticle structure that perturbs the desired orientation between the polarization direction of the light and the radiation-induced distribution of the index of refraction.

As already mentioned, strong radiation-induced changes occur in the optical properties especially of optical elements 4, 9 where the radiation is concentrated on a small partial region of the total surface. This is explained by means of FIG. 5. Other circumstances shall also be discussed where a strong radiation effect comes into play.

FIG. 5 shows a sample embodiment of the projection lens 7 in a meridional cross section. This represents, for example, a catadioptric design. The details of the design are not of interest to the invention. The design is used merely as an example to explain under which circumstances especially strong radiation effects typically occur.

The projection lens 7 has, among others, a lens 11 and a lens 12, each arranged near the aperture diaphragm and moreover having a relatively small usable optical surface. Lenses 11 and 12, due to their small dimensions, already experience so strong a local concentration of the radiation effects that this can unacceptably influence the optical properties of lenses 11 and 12. Without taking into account other factors of influence, the local concentration of radiation effects increases with diminishing size of the usable optical surface. In the context of the invention, therefore, one introduces a threshold value for the diameter of the usable optical surface and when this is crossed one or more of the above described measures for limiting the unwanted effects of the radiation influence will be adopted for the particular optical element. The threshold value will preferably be a diameter of the usable optical surface of 200 mm. The possibility also exists of already adopting steps for optical elements having a usable optical surface with a diameter of less than 240 mm.

Furthermore, focusing effects occurring, for example, in the last focusing lens group before the image plane 8, lead to an increased local concentration of radiation effects and, thus, to an elevated risk of radiation-induced changes. This holds especially for lenses that are arranged at a clear distance of at most 15%, preferably at most 8%, of the structural length of the projection lens 7 from the image plane 8. As the absolute numerical value for this clear distance, one can use a maximum value of 200 mm, preferably 100 mm.

Besides a local concentration of the radiation effects, other effects can also lead to an increased radiation influence. Thus, the projection lens 7 shown in FIG. 5 has a lens 13 and a lens 14, both of which have a concave mirror 15 in front of them. The concave mirror 15 is situated opposite a geometrical beam splitter 16. This arrangement has the result that, when light passes through the projection lens 7, it goes twice through the lenses 13 and 14; once before the light arriving from the geometrical beam splitter 16 strikes the concave mirror 15 and once after the light has been reflected from the concave mirror 15. Accordingly, the two lenses 13 and 14 are subjected to an increased radiation effect.

The invention claimed is:

1. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces irreversible changes in at least one optical element, of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object.

2. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object, wherein the changes in the at least one optical element of the projection exposure apparatus are produced by compaction or rarefaction.

3. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object, wherein the exposure mode enters the approximation calculation in the form of an angle distribution of the light in the object plane.

4. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object, wherein the influencing of the optical properties of the projection exposure apparatus or of the quantity depending on them can be factored in cumulatively.

5. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object, wherein operating phases of the projection exposure apparatus with different exposure modes and/or different objects enter the approximation calculation in the form of a root mean square weighted according to the length of the operating phases.

6. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object, wherein a diffraction angle distribution of the light diffracted by the object is calculated in the context of the approximation computation.

7. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object, wherein the structure of the object is projected by a projection lens onto the substrate and a characteristic quantity of the projection lens is factored into the approximation computation, wherein the characteristic quantity of the projection lens enters the approximation computation in the form of a rectangular function.

8. The method of claim 7, wherein the characteristic quantity of the projection lens is connected to the diffraction angle distribution.

9. A method for operating a projection exposure apparatus to project the image of a structure of an object arranged in an object plane onto a substrate arranged in an image plane, the method comprising the steps of:

illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;

making allowance in the operation of the projection exposure apparatus for the influence of the optical properties of the projection exposure apparatus by a quantity dependent on the optical properties; and calculating said quantity approximately on the basis of one of the several adjustable exposure modes used and the structure of the object, wherein the approximation computation will make use of at least one parameter that is determined in advance by a comparison of the approximation computation against a computation by another method of computation and/or against a measurement.

10. The method of claim 9, wherein a finite element computation is used as the other computation method.

11. The method of claim 9, wherein the parameter is first determined by comparison of several approximation computations, carried out for different exposure modes, against computations according to the other computational method or against several measurements, each of which are carried out for the same exposure modes as the approximation computations.

12. A method for operating a projection exposure apparatus to project the image of a structure of an object arranged in an object plane onto a substrate arranged in an image plane, the method comprising the steps of:
- illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;
- making allowance in the operation of the projection exposure apparatus for the influence of the optical properties of the projection exposure apparatus by a quantity dependent on the optical properties; and
- calculating said quantity approximately on the basis of one of the several adjustable exposure modes used and the structure of the object,
- wherein, depending on the outcome of the approximately calculated influencing of the optical properties of the projection exposure apparatus or the quantity dependent thereon, one changes the position of one or more optical elements by at least one of a translatory and a rotatory movement.

13. A method for operating a projection exposure apparatus to project the image of a structure of an object arranged in an object plane onto a substrate arranged in an image plane, the method comprising the steps of:
- illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;
- making allowance in the operation of the projection exposure apparatus for the influence of the optical properties of the projection exposure apparatus by a quantity dependent on the optical properties; and
- calculating said quantity approximately on the basis of one of the several adjustable exposure modes used and the structure of the object,
- wherein one or more optical elements are replaced depending on the outcome of the approximately calculated influencing of the optical properties of the projection exposure apparatus or the quantity dependent thereon.

14. A method for operating a projection exposure apparatus to project the image of a structure of an object arranged in an object plane onto a substrate arranged in an image plane, the method comprising the steps of:
- illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;
- making allowance in the operation of the projection exposure apparatus for the influence of the optical properties of the projection exposure apparatus by a quantity dependent on the optical properties; and
- calculating said quantity approximately on the basis of one of the several adjustable exposure modes used and the structure of the object,
- wherein the shape of one or more optical elements is changed depending on the outcome of the approximately calculated influencing of the optical properties of the projection exposure apparatus or the quantity dependent thereon.

15. A method for operating a projection exposure apparatus to project the image of a structure of an object arranged in an object plane onto a substrate arranged in an image plane, the method comprising the steps of:
- illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;
- making allowance in the operation of the projection exposure apparatus for the influence of the optical properties of the projection exposure apparatus by a quantity dependent on the optical properties; and
- calculating said quantity approximately on the basis of one of the several adjustable exposure modes used and the structure of the object,
- wherein one ascertains a maximum value of a characteristic quantity for the light with which the projection exposure apparatus is operated as part of the approximation computation.

16. The method of claim 15, wherein if the maximum value of the characteristic quantity for the light is maintained during a given operating period, a threshold value for the influencing of the optical properties of the projection exposure apparatus or a quantity dependent thereon will not be exceeded.

17. A method for operating a projection exposure apparatus to project the image of a structure of an object arranged in an object plane onto a substrate arranged in an image plane, the method comprising the steps of:
- illuminating the object with light of an operating wavelength of the projection exposure apparatus according to one of several adjustable exposure modes, wherein the illuminating of the object produces changes in at least one optical element of the projection exposure apparatus, wherein the changes in at least one optical element influences the optical properties of the projection exposure apparatus;
- making allowance in the operation of the projection exposure apparatus for the influence of the optical properties of the projection exposure apparatus by a quantity dependent on the optical properties; and
- calculating said quantity approximately on the basis of one of the several adjustable exposure modes used and the structure of the object,
- wherein a characteristic quantity is determined during the approximation computation to indicate the modification produced by the influencing of the optical properties of the projection exposure apparatus in the light passing through the latter.

18. A method for operating a projection exposure apparatus to project the image of a structure of an object arranged in an object plane onto a substrate arranged in an image plane, the method comprising the steps of:

illuminating the object with light of an operating wavelength of the projection exposure apparatus, wherein the illuminating of the object produces changes in at least one optical element of the projection exposure apparatus, wherein the changes in at least one optical element influences the optical properties of the projection exposure apparatus;

upon transgression of a threshold value of influence of the optical properties of the projection exposure apparatus or transgression of a quantity dependent on the optical properties, taking at least one countermeasure for the at least one optical element that was used in establishing the transgression of the threshold value; and wherein said quantity is ascertained on the basis of an exposure dose determined for one or more optical elements, wherein the light produces irreversible changes in the at least one optical element of the projection exposure apparatus.

\* \* \* \* \*